(12) United States Patent
Yonezawa et al.

(10) Patent No.: US 7,964,791 B2
(45) Date of Patent: Jun. 21, 2011

(54) CHALCOPYRITE TYPE SOLAR CELL

(75) Inventors: Satoshi Yonezawa, Tochigi (JP);
Tadashi Hayashida, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 875 days.

(21) Appl. No.: 11/718,434

(22) PCT Filed: May 24, 2006

(86) PCT No.: PCT/JP2006/310361
§ 371 (c)(1),
(2), (4) Date: May 2, 2007

(87) PCT Pub. No.: WO2006/126590
PCT Pub. Date: Nov. 30, 2006

(65) Prior Publication Data
US 2009/0065060 A1  Mar. 12, 2009

(30) Foreign Application Priority Data

May 24, 2005  (JP) ................................ 2005-151152

(51) Int. Cl.
*H01L 31/042* (2006.01)
*B05D 5/12* (2006.01)
(52) U.S. Cl. ........... 136/265; 136/262; 136/264; 427/74
(58) Field of Classification Search .................. 136/262, 136/264, 265
See application file for complete search history.

(56) References Cited

U.S. PATENT DOCUMENTS

| | | | |
|---|---|---|---|
| 5,100,480 A | 3/1992 | Hayafuji | |
| 5,626,688 A * | 5/1997 | Probst et al. | 136/265 |
| 5,733,381 A * | 3/1998 | Ota et al. | 136/244 |
| 6,127,202 A | 10/2000 | Kapur et al. | |
| 6,310,281 B1 * | 10/2001 | Wendt et al. | 136/256 |
| 6,673,997 B2 * | 1/2004 | Blieske et al. | 136/251 |
| 7,122,398 B1 * | 10/2006 | Pichler | 438/66 |

(Continued)

FOREIGN PATENT DOCUMENTS

JP  81403  4/1929

(Continued)

OTHER PUBLICATIONS

Delahoy et al., "New technologies for CIGS photovoltaics", Solar Energy 77, 2004.*

*Primary Examiner* — Jennifer K. Michener
*Assistant Examiner* — Matthew T Martin
(74) *Attorney, Agent, or Firm* — Rankin, Hill & Clark LLP (57) ABSTRACT

A first electrode layer 14 is formed on a mica substrate 54, and then first scribe portions 64 are disposed. Next, a light absorbing layer 16 and a buffer layer 18 are disposed on the first electrode layer 14, and through holes (second scribe portions 66) which penetrate from the upper end face of the buffer layer 18 to the lower end face of the mica substrate 54 are formed in a spot-like manner. Then, a second electrode layer 20 is disposed on the buffer layer 18. At this time, the lower end face of the second electrode layer 20 reaches the first electrode layer 14 along the inner peripheral walls of the second scribe portions 66. Furthermore, the second electrode layer 20 is scribed to dispose third scribe portions 70.

8 Claims, 10 Drawing Sheets

U.S. PATENT DOCUMENTS 7,560,641 B2 * 7/2009 Menezes .................. 136/264

FOREIGN PATENT DOCUMENTS

| JP | 59-119877 | 7/1984 |
|----|-----------|--------|
| JP | 59-119878 | 7/1984 |
| JP | 61-15763 | 1/1986 |
| JP | 4-2174 | 1/1992 |
| JP | 5-259494 | 10/1993 |
| JP | 7-321355 | 12/1995 |
| JP | 08125206 A * | 5/1996 |
| JP | 11-340482 | 12/1999 |
| JP | 2000-58893 | 2/2000 |
| JP | 2001-156026 | 6/2001 |
| JP | 2001-156312 | 6/2001 |
| JP | 2001-257374 | 9/2001 |
| JP | 2001-339081 | 12/2001 |
| JP | 2003-69064 | 3/2003 |
| WO | 98/50962 | 11/1998 |

* cited by examiner

CHALCOPYRITE TYPE SOLAR CELL

TECHNICAL FIELD

The present invention relates to a chalcopyrite solar cell, and more particularly to a chalcopyrite solar cell in which adjacent unit cells are electrically connected in series to one other to configure one module.

BACKGROUND ART

Figure 7:
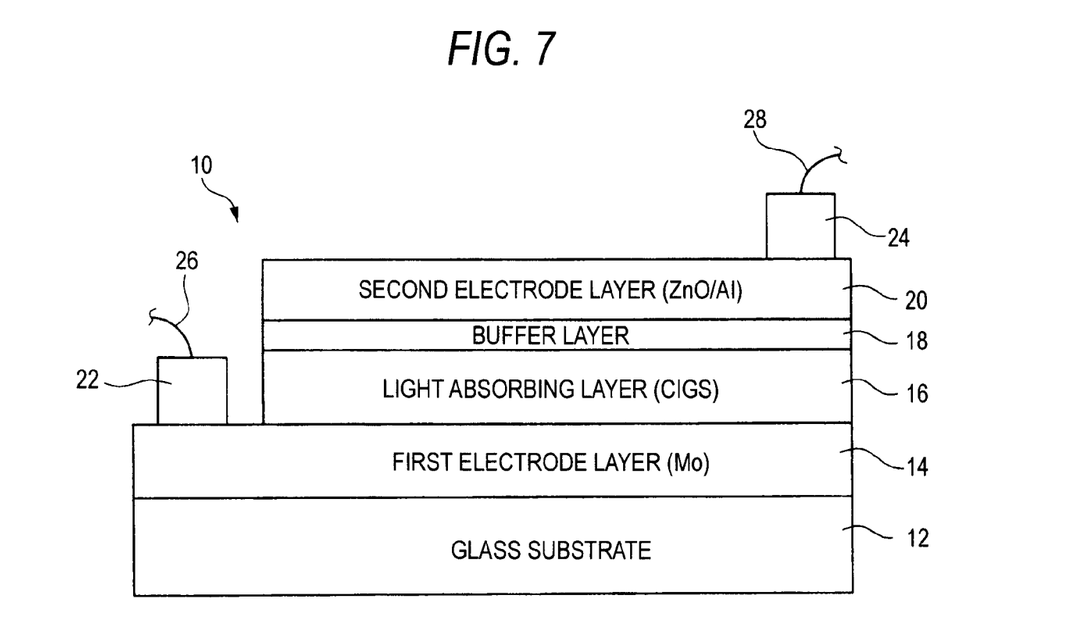
FIG. 7 is a sectional view in the stacking direction of a chalcopyrite solar cell of the prior art.

FIG. 7 is a side view in the stacking direction of a usual chalcopyrite solar cell 10. The chalcopyrite solar cell 10 is configured by disposing a first electrode layer 14 made of Mo, a light absorbing layer 16 made of Cu(InGa)Se (hereinafter, often referred to as CIGS), a buffer layer 18 made of CdS, ZnO, InS, or the like, and a transparent second electrode layer 20 made of ZnO/Al on a glass substrate 12 in this sequence. In FIG. 7, the reference numerals 22, 24 denote a first lead portion and a second lead portion, and lead wires 26, 28 are connected to the lead portions 22, 24.

In this way, the chalcopyrite solar cell 10 is a solar cell comprising a chalcopyrite compound which is typified by CIGS, as the light absorbing layer 16, and also called a I-III-VI cell.

When the chalcopyrite solar cell 10 is irradiated with light such as solar light, pairs of an electron and a hole are generated in the light absorbing layer 16. In the junction interface between the light absorbing layer 16 made of CIGS which is a P-type semiconductor, and the second electrode layer 20 of the N-type semiconductor, electrons gather in the interface of the second electrode layer 20 (N-type side), and holes gather in the interface of the light absorbing layer 16 (P-type side). Since this phenomenon occurs, an electromotive force is generated between the light absorbing layer 16 and the second electrode layer 20. The electric energy due to the electromotive force is taken out to the outside as a current from the first lead portion 22 and second lead portion 24 which are connected respectively to the first electrode layer 14 and the second electrode layer 20.

Usually, the chalcopyrite solar cell 10 is produced in the following manner. First, the first electrode layer 14 made of Mo is formed by sputtering or the like on the glass substrate 12 made of soda-lime glass or the like.

Figure 8:
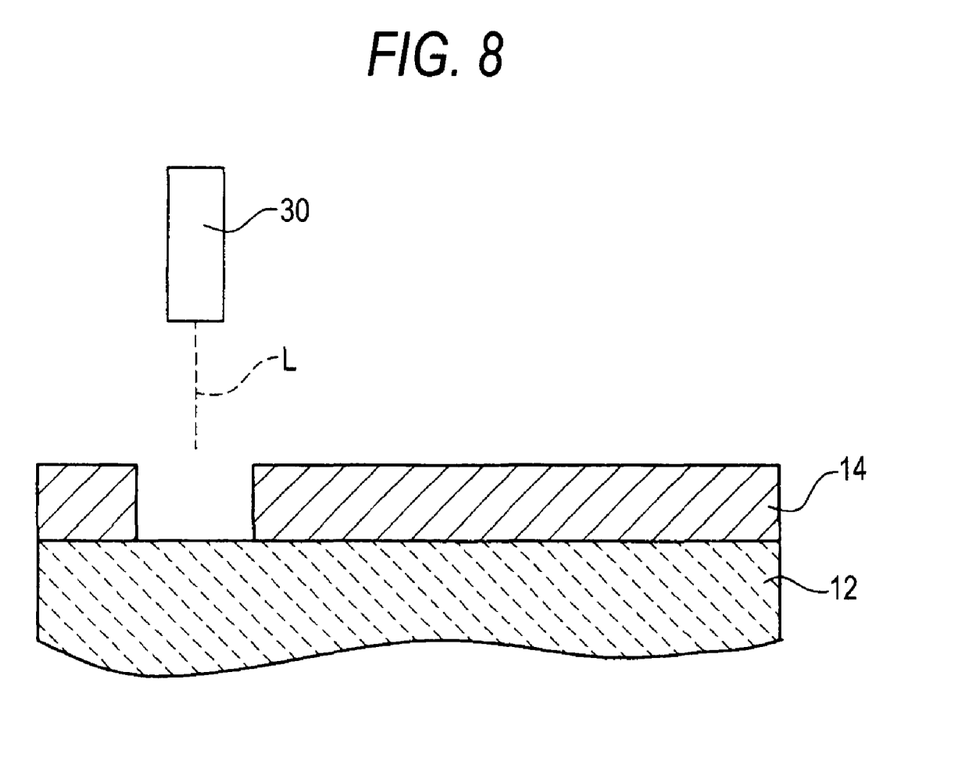
FIG. 8 is a sectional view in the stacking direction showing a state where a scribing process is applied on a first electrode layer in production of the chalcopyrite solar cell shown in FIG. 7.

Next, as shown in FIG. 8, irradiation of a laser beam L is repeated while linearly scanning laser irradiation 30, and the first electrode layer 14 is divided into plural portions. This operation is called scribe.

After cutting dust produced in the division is removed away by washing, Cu, In, and Ga are deposited onto the first electrode layer 14 by sputtering film formation to dispose a precursor. The precursor is accommodated together with the glass substrate 12 and the first electrode layer 14 in a heat treatment furnace, and an annealing process is performed in an $H_2Se$ gas atmosphere. During the annealing process, selenization of the precursor occurs, and the light absorbing layer 16 made of CIGS is formed.

Next, the N-type buffer layer 18 made of CdS, ZnO, InS, or the like is disposed on the light absorbing layer 16. For example, the buffer layer 18 is formed by sputtering film formation, chemical bath deposition (CBD), or the like.

Figure 9:
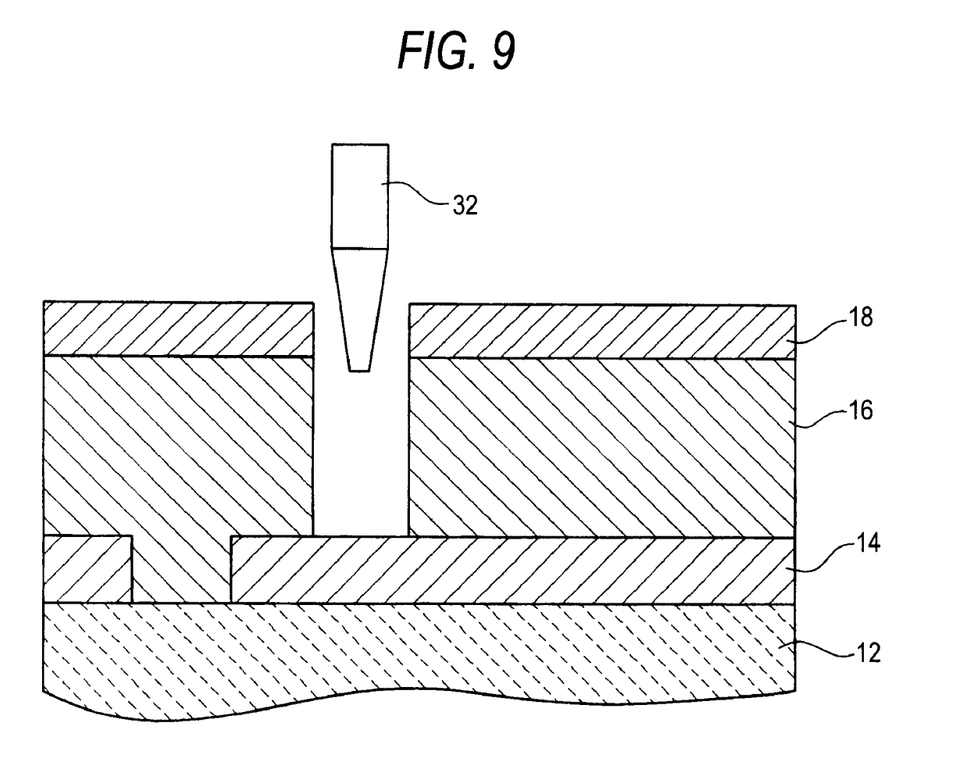
FIG. 9 is a sectional view in the stacking direction showing a state where a second scribing process is performed in succession to FIG. 8.

As shown in FIG. 9, a mechanical scribing process of linearly cutting the buffer layer 18 and the light absorbing layer 16 is performed by using a metal stylus 32. Namely, the buffer layer 18 and the light absorbing layer 16 are divided in a stripe manner by a mechanical technique.

Figure 10:
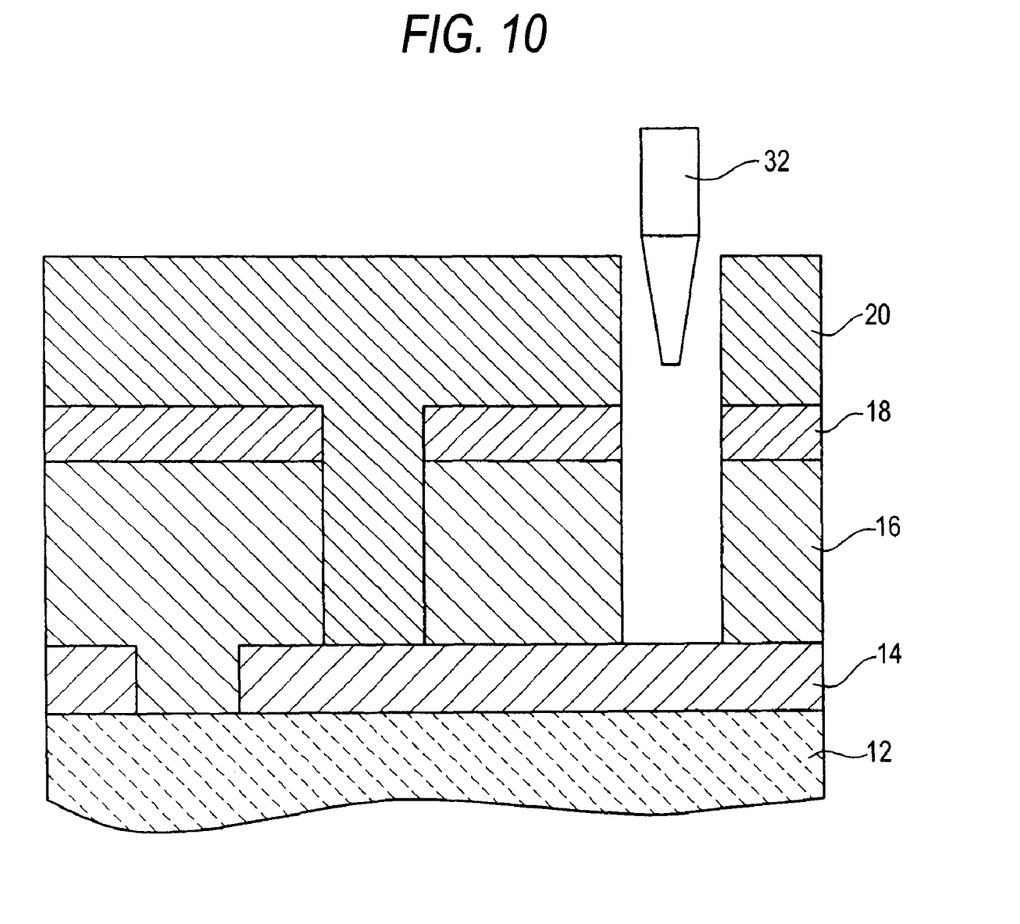
FIG. 10 is a sectional view in the stacking direction showing a state where a third scribing process is performed in succession to FIG. 9.

Next, the second electrode layer 20 made of ZnO/Al is disposed by sputtering film formation. As shown in FIG. 10, thereafter, a mechanical scribing process of linearly cutting the second electrode layer 20, the buffer layer 18, and the light absorbing layer 16 is performed by using the metal stylus 32. As a result of the previous and present mechanical scribing processes, plural unit cells are disposed.

Finally, the first lead portion 22 and the second lead portion 24 are disposed in exposed portions of the first electrode layer 14 and the second electrode layer 20, respectively, thereby obtaining the chalcopyrite solar cell 10.

The chalcopyrite solar cell 10 which is obtained in this way has various advantages such as that the energy conversion efficiency is high, that photo-deterioration due to a secular change seldom occurs, that the radiation resistance is high, that the light absorption wavelength range is wide, and that the light absorption coefficient is large. Various researches for mass production of the solar cell have been conducted.

As described above, it is usual to select glass as the material of the substrate. The reasons of this are that glass is easily available and economical, that the surface is smooth, and hence the surface of a film stacked on the substrate can be made relatively smooth, and that sodium in glass disperses to the light absorbing layer 16 with the result that the energy conversion efficiency is high.

When the glass substrate 12 is used, however, the temperature during the selenization of the precursor cannot be set high. Therefore, it is difficult to advance the selenization to a composition at which the energy efficiency is very high. Since the substrate is thick, there are disadvantages that a feeding apparatus for feeding the glass substrate 12 during production of the chalcopyrite solar cell 10, and the like become large, and that the mass of the produced chalcopyrite solar cell 10 is large. Moreover, the glass substrate 12 is not substantially flexible, and hence it is difficult to apply a mass production method which is called a roll-to-roll process.

As a measure for solving the disadvantages, it is contemplated to change the material of the substrate to that other than glass. For example, Patent Reference 1 proposes a chalcopyrite solar cell in which a polymer film is used as a substrate. In addition, Patent Reference 2 proposes the use of stainless steel as a material of a substrate of a chalcopyrite solar cell, and Patent Reference 3 lists glass, alumina, mica, polyimide, molybdenum, tungsten, nickel, graphite, and stainless steel.

Patent Reference 1: JP-A-5-259494
Patent Reference 2: JP-A-2001-339081
Patent Reference 3: JP-A-2000-58893

DISCLOSURE OF THE INVENTION

Problems that the Invention is to Solve

The polymer film substrate proposed in Patent Reference 1 has a disadvantage that the heat resistance is low and therefore a high temperature is not used in the selenization process.

In the technique disclosed in Patent Reference 2, a protective layer made of $SiO_2$ or $FeF_2$ is disposed in order to prevent the stainless steel substrate from being attacked by selenium during selenization. During the mechanical scribing process, however, the metal stylus 32 may destroy the protective layer and further destroy a passivation film on the surface of the stainless steel substrate. When such a situation occurs, the second electrode layer is contacted with the conductive stainless steel substrate to cause a short circuit.

In the substrate materials proposed in Patent Reference 3, mica is highly insulative and excellent in flexibility. However, mica is thin, and there is a fear that, during the mechanical scribing process, a linear scratch is formed by the metal stylus. In this case, the bending rigidity of a chalcopyrite solar cell is extremely lowered. The contact area between the second electrode layer and the first electrode layer is reduced. Therefore, the series resistance between unit cells is increased, with the result that the performance of the chalcopyrite solar cell is lowered.

The invention has been conducted in order to solve the above-discussed problems. It is an object of the invention to provide a chalcopyrite solar cell in which there is no fear that a scratch is produced in a mica substrate, the bending rigidity is ensured, and the resistance between unit cells is not increased.

Means for Solving the Problems

In order to attain the object, the chalcopyrite solar cell of the invention is a solar cell wherein at least a binder layer containing a nitride, a first electrode layer, a P-type light absorbing layer made of a chalcopyrite compound, a buffer layer, and a transparent n-type second electrode layer are stacked on an insulative substrate containing mica, the solar cell is divided into unit cells by disposing: first scribe portions which linearly divide the first electrode layer; second scribe portions configured by through holes which penetrate from the insulative substrate to a layer that is positioned immediately below the second electrode layer; and third scribe portions which divide the second electrode layer, and the first and second electrode layers of adjacent unit cells are electrically connected to each other by existence of a portion on a lower end face of the second electrode layer, the portion extending to reach the first electrode layer along inner walls of the second scribe portions.

Namely, in the invention, through holes which exist in a spot-like manner, and which penetrate in the stacking direction are disposed as the second scribe portions. Even when the second scribe portions are disposed by performing mechanical scribing with using a metal stylus or the like, therefore, formation of a linear scratch in the mica substrate is avoided. Accordingly, the bending rigidity of the mica substrate is ensured.

Since the mica substrate is originally highly flexible, moreover, a chalcopyrite solar cell which is excellent in flexibility can be configured.

The first scribe portions, the second scribe portions, and the third scribe portions can be disposed with using existing facilities, and by simple operations. Namely, in accordance with the disposition of through holes as the second scribe portions, the work is not complicated, and a special apparatus is not required.

In the formation of through holes, moreover, the work is more easily performed than the case where a linear cutout is disposed, and ends in a short time. Therefore, the working efficiency is improved, and hence the production amount per unit time can be increased.

Furthermore, "a layer which is positioned immediately below the second electrode layer" is not restricted to the buffer layer. Namely, in the case where a high-resistance layer made of insulative ZnO or the like is interposed between the buffer layer and the second electrode layer, for example, the high-resistance layer is "a layer which is positioned immediately below the second electrode layer".

For example, the third scribe portions may be formed so as to comprise linear parts and curved parts. In this case, preferably, the linear parts are disposed in parallel to the first scribe portions, and the curved parts are disposed at positions where the curved parts cooperate with the first scribe portions to surround the second scribe portions. According to the configuration, the electricity generating region is increased as compared with the prior art in which cutout portions are formed in parallel to one another by three scribing processes, and hence the actual generated electricity is increased.

Preferably, a smoothing layer which is smoother than the mica substrate is disposed between the mica substrate and the binder layer. According to the configuration, asperities (undulation) of the surface of the mica substrate are buried by the smoothing layer. Therefore, transfer of undulation of the mica substrate to the binder layer, the first electrode layer, and the light absorbing layer can be avoided. As a result, it is possible to prevent the open voltage of the chalcopyrite solar cell from being lowered to reduce the conversion efficiency.

In this case, preferably, a ceramics film is interposed between the mica substrate and the smoothing layer. According to the configuration, transfer of undulation of the mica substrate can be avoided more easily.

Effects of the Invention

According to the invention, through holes which penetrate in the stacking direction are disposed as the second scribe portions. According to the configuration, it is not required to form the through holes so as be linearly continuous. Even when a metal stylus or the like is used in disposition of the second scribe portions to perform a mechanical scribing process, therefore, it is possible to avoid formation of a linear scratch in the mica substrate. Accordingly, it is possible to configure a chalcopyrite solar cell in which the bending rigidity is of the mica substrate ensured, and which is highly flexible in accordance with the flexibility of the mica substrate.

Furthermore, through holes can be formed easily as compared with the case where a linear cutout portion is disposed, and the work ends in a short time. Therefore, the production efficiency of the chalcopyrite solar cell can be improved.

DESCRIPTION OF REFERENCE NUMERALS AND SIGNS 10, 50 ... chalcopyrite solar cell
12 ... glass substrate
14 ... first electrode layer
16 ... light absorbing layer
18 ... buffer layer
20 ... second electrode layer
30 ... laser irradiation
31 ... punch
32 ... metal stylus
52 ... unit cell
54 ... mica substrate
56 ... binder layer
64 ... first scribe portion
66 ... second scribe portion
68 ... downward portion
70 ... third scribe portion
72 ... linear part
74 ... curved part

BEST MODE FOR CARRYING OUT THE INVENTION

Hereinafter, a preferred embodiment of the chalcopyrite solar cell of the invention will be described in detail with reference to the accompanying drawings. Components which are identical with those shown in FIGS. 7 to 10 are denoted by the same reference numerals, and their detailed description is omitted.

Figure 1:
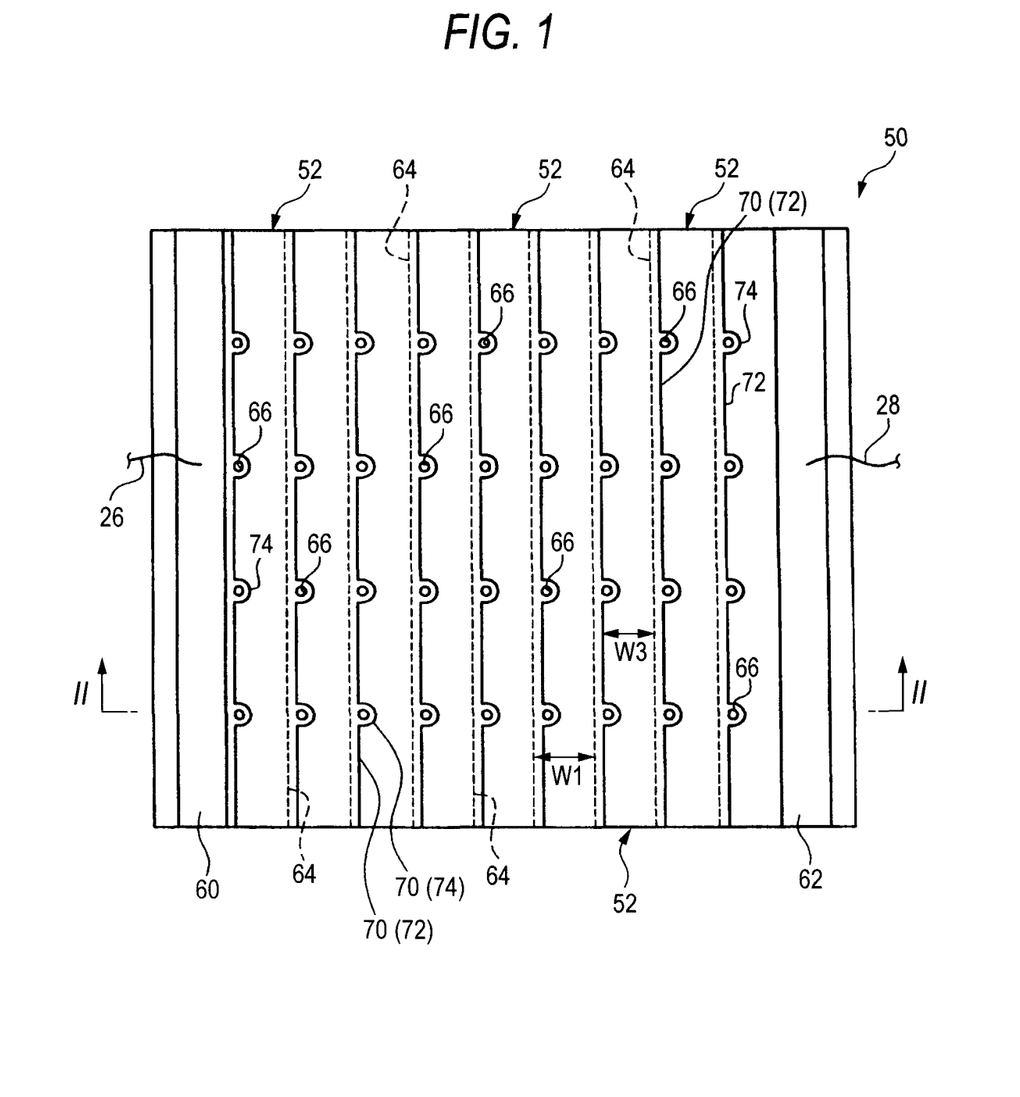
FIG. 1 is an upper plan view of a chalcopyrite solar cell of the embodiment.
Figure 2:
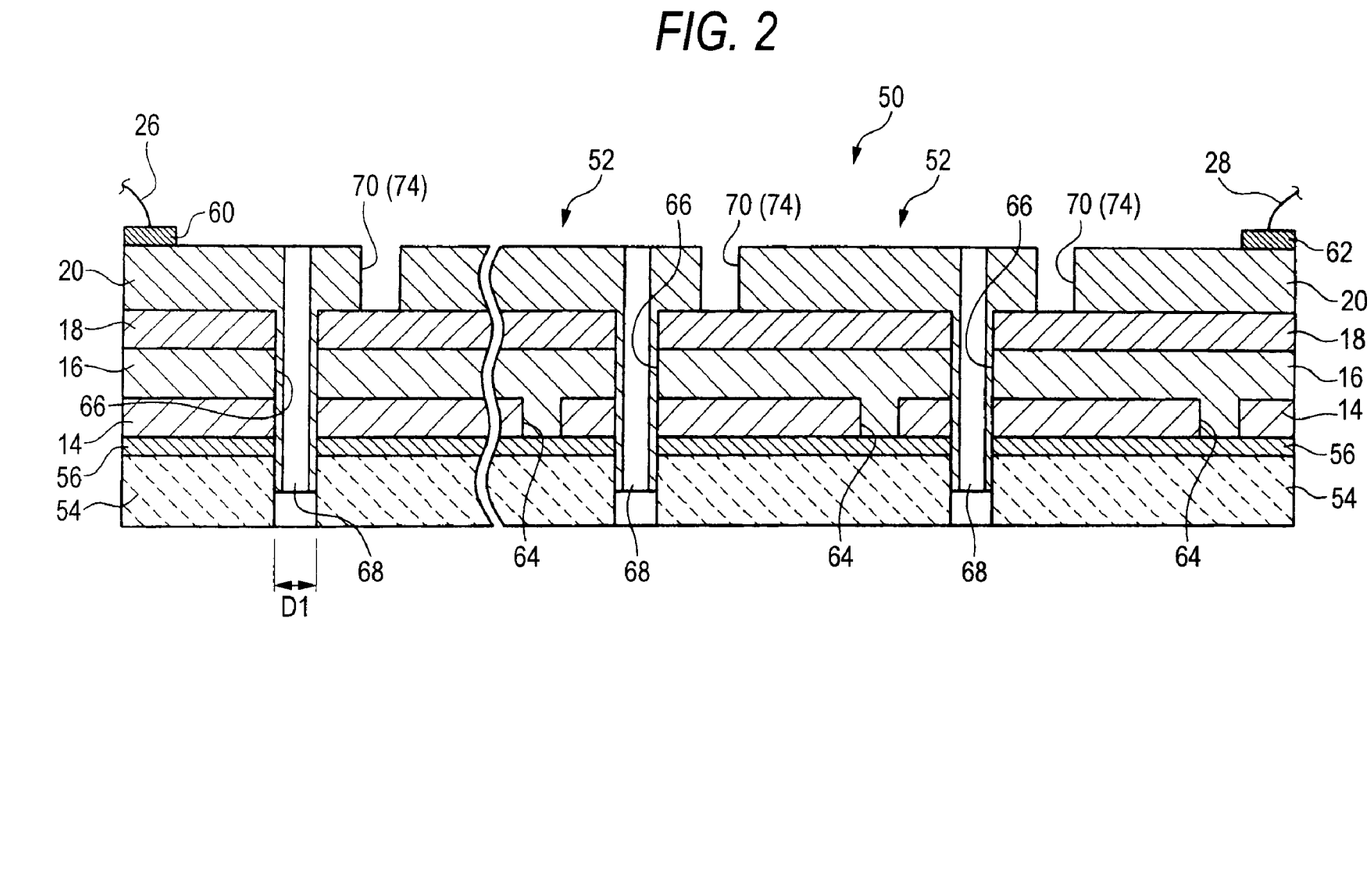
FIG. 2 is a sectional view taken along the line II-II of FIG. 1.

FIG. 1 is an upper plan view of a chalcopyrite solar cell 50 of the embodiment, and FIG. 2 is a sectional view taken along the line II-II of FIG. 1. The chalcopyrite solar cell 50 is configured by electrically connecting plural unit cells 52 in series to one other.

Referring to FIG. 2, first, the stacked structure of the unit cells 52 will be described. Each of the unit cells 52 is configured by stacking a binder layer 56 of a nitride, the first electrode layer 14, the P-type light absorbing layer 16 made of a chalcopyrite compound, the buffer layer 18, and a second electrode layer 20 which is transparent and of the n type, on a mica substrate 54 in this sequence.

In the embodiment, the mica substrate 54 is formed by integrated mica. Here, integrated mica indicates a member which is obtained by mixing particulate mica with resin and then firing the mixture.

Integrated mica is an insulator which has a very high resistance of $10^{12}$ to $10^{16}\Omega$, and has a property that it is highly resistant to an acid, an alkali, $H_2Se$ gas, and the like. Moreover, integrated mica is light, and excellent in flexibility. Furthermore, in contrast to that the allowable temperature of the glass substrate 12 of soda-lime glass or the like is 500 to 550° C., integrated mica has a relatively high allowable temperature of 600 to 800° C.

The binder layer 56 is a layer for firmly bonding the mica substrate 54 with the first electrode layer 14, and functions also as a diffusion preventing layer which prevents impurities diffused from the mica substrate 54 from being diffused to the first electrode layer 14. That is, the existence of the binder layer 56 prevents impurities contained in the mica substrate 54, such as Al, K, Li, Na, Mg, and F from being diffused to the light absorbing layer 16. Therefore, the chalcopyrite solar cell 50 has a high energy conversion efficiency.

As the material of the binder layer 56, a nitride is selected. Preferred examples are TiN and TaN which satisfactorily bond to both the mica substrate 54 and the first electrode layer 14 (Mo).

Preferably, the thickness of the binder layer 56 is 0.5 to 1 μm. When less than 0.5 μm, the layer cannot easily function as a barrier. When more than 1 μm, the bonding strength cannot be easily ensured.

The first electrode layer 14 made of Mo, the light absorbing layer 16 made of CIGS, the buffer layer 18 made of CdS, or the like, and the transparent second electrode layer 20 made of ZnO/Al are stacked on the binder layer 56 in this sequence. A positive electrode 60 is disposed on the second electrode layer 20 of the unit cell 52 which is positioned at the left end in FIGS. 1 and 2. By contrast, a negative electrode 62 is disposed on the second electrode layer 20 of the unit cell 52 which is positioned at the right end. Lead wires 26, 28 are connected to the electrodes 60, 62.

A scribing process which will be described later is applied to the first electrode layer 14, thereby disposing cutout portions (hereinafter, referred to as first scribe portions 64). As shown in FIG. 1, the first scribe portions 64 are linearly formed, and have a width of about 100 μm. During a process of disposing the light absorbing layer 16, CIGS is filled in the first scribe portions 64 (see FIG. 2).

The distance W1 between the first scribe portions 64, 64 is not particularly restricted, and may be set to, for example, several mm.

Figure 3:
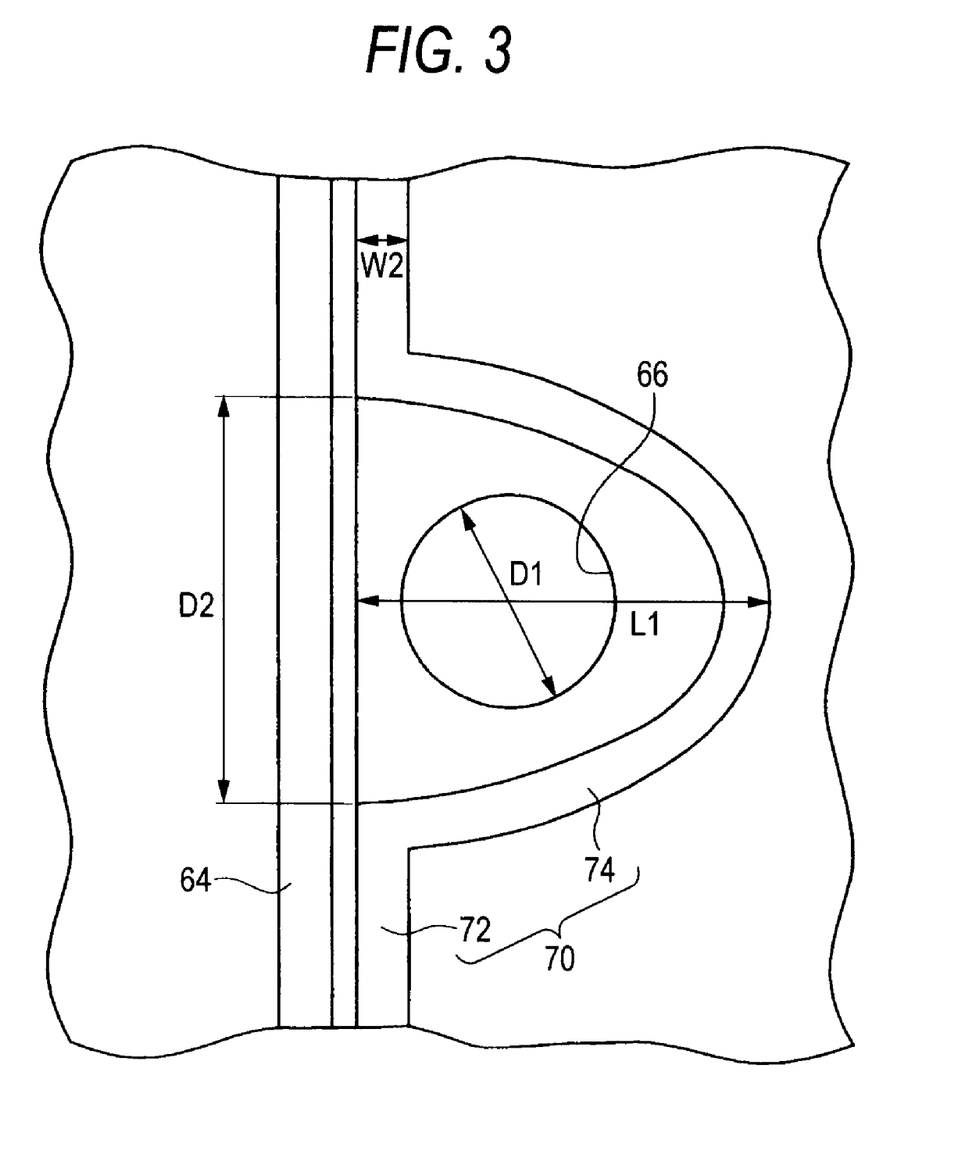
FIG. 3 is an enlarged upper plan view enlargedly showing main portions in the vicinity of a second scribe portion shown in FIG. 1.

Second scribe portions 66 serving as through holes are disposed so as to penetrate from the upper end face of the second electrode layer 20 to the lower end face of the mica substrate 54. Namely, plural second scribe portions 66 which penetrate from the lowermost layer (the mica substrate 54) to the uppermost layer (the second electrode layer 20) are disposed in a spot-like manner in the chalcopyrite solar cell 50. As shown in FIGS. 1 and 3, in consideration of the resistance (Rs) value of the second electrode layer 20, the second scribe portions 66 are disposed while being separated from the first scribe portions 64 by a predetermined distance.

Preferably, the diameter D1 and number of the second scribe portions 66 are set so that a loss due to a contact resistance in the contact of the first electrode layer 14 and the second electrode layer 20 is equal to or less than 1%. When the diameter D1 of the second scribe portions 66 is set to 0.05 mm or 1 mm, for example, the contact resistance of each of the second scribe portions 66 is $31.8\Omega$ or $1.6\Omega$. When, based on the value, the number of the second scribe portions 66 required in each of the unit cells 52 is obtained, the number is 80 or 4.

To the inner peripheral wall of each second scribe portion 66, the second electrode layer 20 is adhered along the circumferential direction of the inner peripheral wall (see FIG. 2). That is, a downward portion 68 is projected from the lower end face of the second electrode layer 20, and the downward portion 68 extends between the upper side of the buffer layer 18 and the mica substrate 54. Inside the second scribe portion 66, the side peripheral wall of the downward portion 68 of the second electrode layer 20 is contacted with the inner peripheral wall of the first electrode layer 14, whereby adjacent unit cells 52, 52 are electrically connected to each other in series.

As shown in FIGS. 1 and 2, third scribe portions 70 are disposed so as to cut away the second electrode layer 20. The third scribe portions 70 have linear parts 72 and curved parts 74. Among them, the linear parts 72 are formed in parallel and in close proximity to the first scribe portions 64 (see FIG. 1). As shown in FIGS. 1 and 3, the curved parts 74 are curvedly formed so as to surround the second scribe portions 66. In this case, namely, the curved parts 74 are disposed in a semicircular manner so as to circumvent the second scribe portions 66.

In the case where the diameter D1 of the second scribe portions 66 is 1 mm, for example, both the opening diameter D2 of the curved parts 74, and the distance L1 from the opening end to the bottom of the curve may be set to 2 mm. The width W2 of the third scribe portions 70 may be set to be approximately equal to the width of the first scribe portions 64, i.e., about 100 μm.

As shown in FIG. 1, the cell width W3 of the unit cells 52 is defined as the distance between the linear part 72 of the third scribe portion 70, and one of two first scribe portions 64, 64 adjacent to the third scribe portion 70 which one is most remotest from the third scribe portion.

The chalcopyrite solar cell 50 can be produced in the following manner.

First, integrated mica which is wound in a roll-like manner is drawn out to be formed as the mica substrate 54. In the case where integrated mica is used in this way, it is easy to apply a mass production method which is called a roll-to-roll process. That is, mass production of the chalcopyrite solar cell 50 can be performed.

Then, the binder layer 56 (nitride) and the first electrode layer 14 (Mo) are formed on the mica substrate 54 by sputtering or the like.

Figure 4:
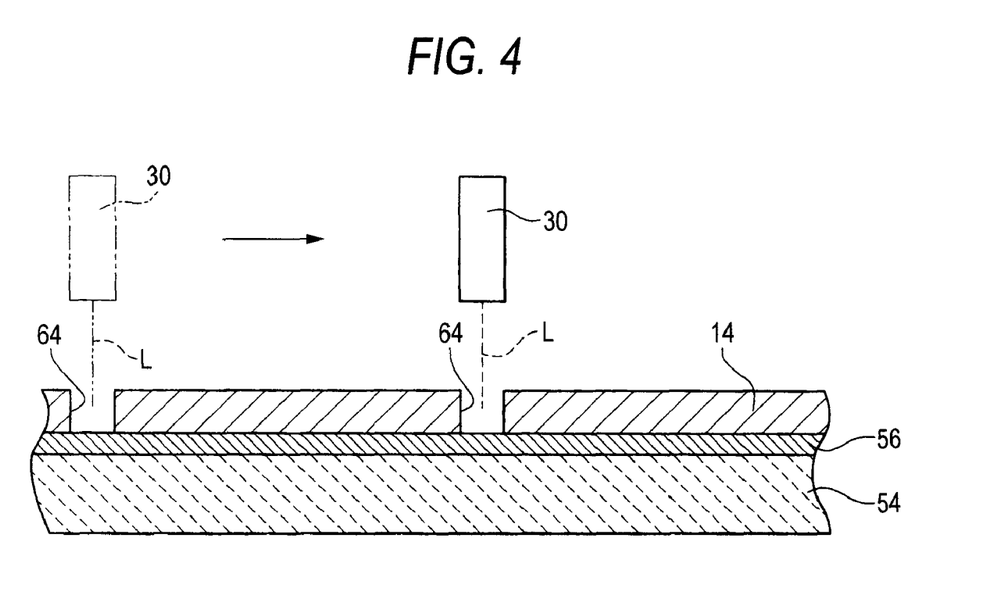
FIG. 4 is a sectional view in a stacking direction showing a state where first scribe portions are disposed.

Next, as shown in FIG. 4, the upper face of the first electrode layer 14 is irradiated with the laser beam L via the laser irradiation 30, and the laser irradiation 30 is linearly scanned, thereby applying the scribing process on the first electrode layer 14. As a result, the linear first scribe portion 64 is formed.

After the laser irradiation 30 is displaced by a predetermined distance, this work is repeated, whereby the plural first scribe portions 64 are disposed, and the first electrode layer 14 is divided into plural portions. In this scribing process in which the irradiation of the laser beam L is performed, the mica substrate 54 is not divided.

After cutting dust produced in the scribing process is removed away by means such as washing or a dry process, Cu, In, and Ga are deposited onto the first electrode layer 14 by sputtering film formation to dispose a precursor. The precursor is accommodated together with the mica substrate 54 and the first electrode layer 14 in a heat treatment furnace, and an annealing process is performed in an $H_2Se$ gas atmosphere. During the annealing process, selenization of the precursor occurs, and the light absorbing layer 16 made of CIGS is formed.

The heat and corrosion resistances of the mica substrate 54 are very superior to those of the glass substrate 12. Therefore, selenization can be applied on the precursor which is formed on the first electrode layer 14 in order to dispose the light absorbing layer 16, with using $H_2Se$ gas at about 500 to 700° C. Under such conditions, particularly at the vicinity of 700° C., it is possible to surely advance the selenization of the precursor. In the chalcopyrite solar cell 50 which is a final product, therefore, the open circuit voltage is very high.

The reason of this is inferred that the selenization in a gas phase is performed at 600 to 700° C. to form the light absorbing layer 16 in which Ga in a crystalline state is dispersed in an approximately uniform manner, and hence the bandgap is widened.

As required, sodium may be added to the precursor before the annealing process. In this case, Na is dispersed, and hence grains are grown, with the result that the light absorbing layer 16 having a high energy conversion efficiency is obtained.

A part of the light absorbing layer 16 is formed in the first scribe portions 64. Therefore, the first scribe portions 64 are filled with the light absorbing layer 16.

Next, the N-type buffer layer 18 of CdS, ZnO, InS, or the like is formed on the light absorbing layer 16 by, for example, sputtering film formation or CBD.

Figure 5:
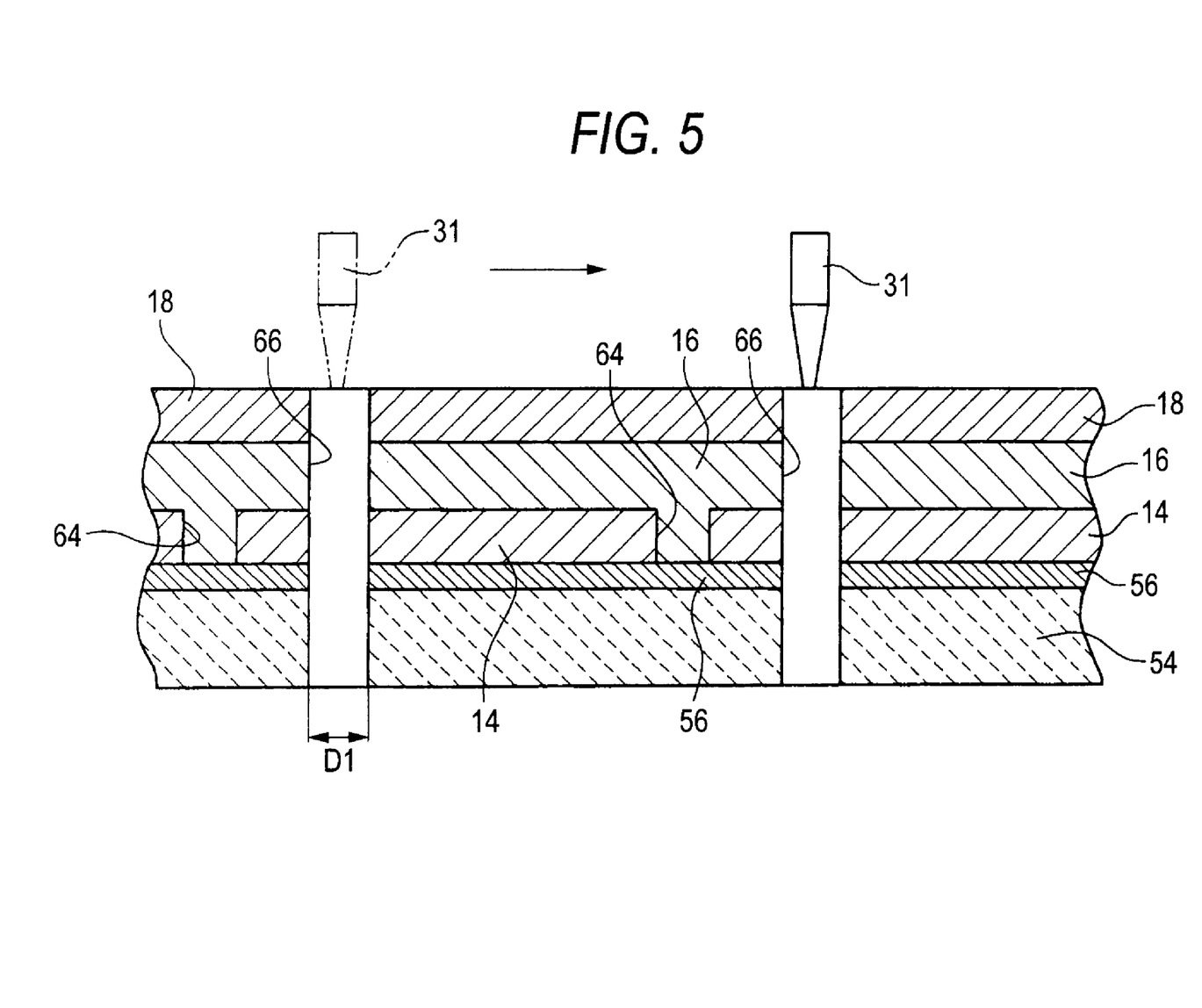
FIG. 5 is a sectional view in the stacking direction showing a state where the second scribe portions are disposed.

Then, a spot-like boring process is performed with using a punch 31 or the like on the buffer layer 18 and the light absorbing layer 16. Namely, as shown in FIG. 5, through holes (the second scribe portions 66) which penetrate to the lower end face of the mica substrate 54 via the buffer layer 18, the light absorbing layer 16, and the first electrode layer 14 are disposed.

As a result, the second scribe portions 66 can be disposed by simple works and at a low cost.

Next, the second electrode layer 20 made of ZnO/Al is disposed by sputtering film formation. At this time, the downward portion 68 which extends from the lower end face on the buffer layer 18 to the mica substrate 54 along the inner peripheral wall of the second scribe portion 66 is formed in the second electrode layer 20. As described above, the side peripheral wall of the downward portion 68 is contacted with the inner peripheral wall of the first electrode layer 14.

Figure 6:
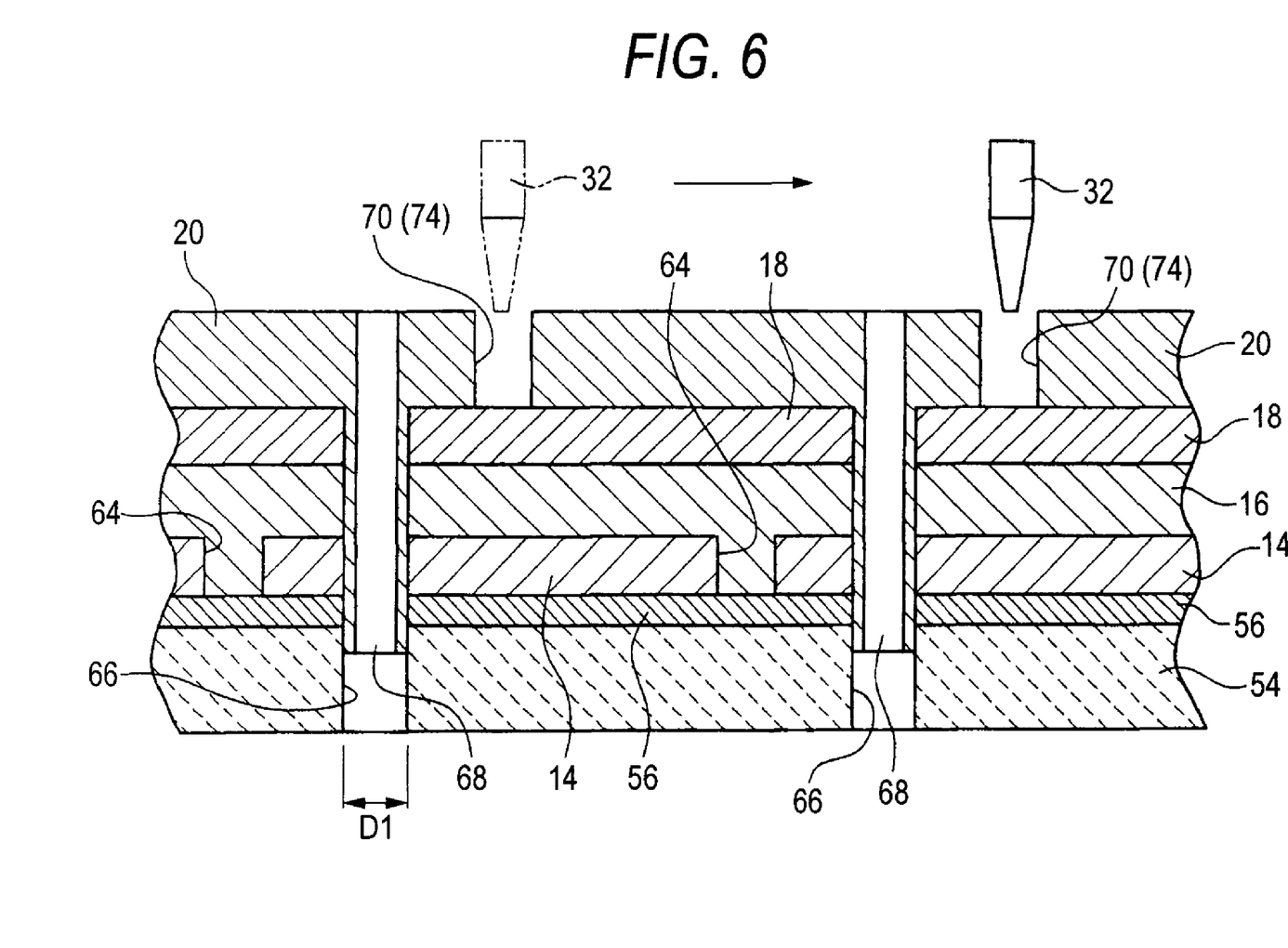
FIG. 6 is a sectional view in the stacking direction showing a state where third scribe portions are disposed.

As shown in FIG. 6, then, a scribing process is performed by linearly scanning the metal stylus 32, and, during the scanning process, conducting a curved scanning operation so as to circumvent the second scribe portions 66, whereby the third scribe portions 70 having the linear parts 72 and the curved parts 74 are formed in the second electrode layer 20. This third scribing process may be performed by the laser irradiation 30 (see FIG. 4).

As a result of the scribing process, plural unit cells 52 are disposed (see FIG. 6). Adjacent one of the unit cells 52, 52 are electrically connected to each other by causing the tip end face of the downward portion 68 of the second electrode layer 20 to be contacted with the first electrode layer 14.

The thus configured chalcopyrite solar cell 50 has the mica substrate 54, and hence is highly flexible. Furthermore, integrated mica is more economical than soda-lime glass, and light. Therefore, the production cost of the chalcopyrite solar cell 50 can be lowered, and the mass of the chalcopyrite solar cell 50 can be reduced.

As the second scribe portions 66, through holes are disposed. That is, unlike the prior art chalcopyrite solar cell 10, the second scribe portions 66 are not linearly formed in the same manner as the first scribe portions 64 and the third scribe portions 70. Moreover, it is not necessary to dispose the third scribe portions 70 so as to extend from the second electrode layer 20 to the first electrode layer 14. Therefore, there is no fear that a scratch is produced in the mica substrate 54. Since the through holes are simply scattered in the mica substrate 54, the bending rigidity of the mica substrate 54 is not excessively lowered.

Furthermore, since the second electrode layer 20 and the first electrode layer 14 are contacted with each other via a sufficient contract area, the increase of the resistance between the unit cells 52, 52 is suppressed.

According to the embodiment, the mica substrate 54 is used, and the through holes are disposed. Therefore, it is possible to configure the chalcopyrite solar cell 50 which is highly flexible, and in which the bending rigidity is ensured, and the series resistance is low.

In the above-described embodiment, the binder layer 56 is disposed on the mica substrate 54. Alternatively, a ceramics film which is thick, and which serves as an intermediate layer, and an $SiO_2$ layer which functions as an adhesion layer may be stacked and formed on the mica substrate 54, and a smoothing layer may formed on the stack. In the alternative, it is possible to avoid transfer of undulation of the upper end face of the mica substrate 54 to the binder layer 56, the first electrode layer 14, and the light absorbing layer 16. Therefore, the open circuit voltage of the chalcopyrite solar cell 50 is raised.

In this case, the ceramics film may be disposed by applying a coating composition containing Ti:O:Si:C:Al=39:28.8: 25.7:2.7:1.6 (the numerals indicate weight ratios) onto the mica substrate 54 by a known technique such as brushing, spraying, or silk screening, and drying the coating composition. Preferably, the thickness of the ceramics film is 2 μm or more, and more preferably 5 μm or more. The thickness of the ceramics film is preferably 20 μm or less.

In a ceramics film of this kind, Si and O are firmly coupled together by ionic bond, and hence the heat resistance is high. In the above selenization process (anneal), consequently, there occurs no disadvantages such as that the ceramics film is deformed.

By contrast, as the material of the smoothing layer, a material which can be firmly bonded to the mica substrate 54 and the binder layer 56 (nitride), such as SiN or $SiO_2$ is selected. In this case, there is a further advantage that a film is easily formed by sputtering.

Moreover, a high-resistance layer made of insulative ZnO or the like may be disposed on the buffer layer 18. In this case, after the high-resistance layer is disposed, the second scribe portions 66 which penetrate from the upper end face of the high-resistance layer to the lower end face of the mica substrate 54 may be disposed. Furthermore, an antireflection layer may be disposed on the second electrode layer 20.

The material of the first electrode layer 14 may be tungsten (W). While the invention has been described in detail with reference to a specific embodiment, it is obvious to those skilled in the art that various changes and modifications can be made without departing from the spirit and range of the invention.

The application is based on Japanese Patent Application (No. 2005-151152) filed May 24, 2005, and its disclosure is incorporated herein by reference.

The invention claimed is:

1. A chalcopyrite solar cell, wherein at least a first electrode layer, a P-type light absorbing layer made of a chalcopyrite compound, a buffer layer, and a transparent n-type second electrode layer are stacked on an insulative substrate containing mica, said solar cell is divided into unit cells by disposing: first scribe portions which linearly divide said first electrode layer; second scribe portions configured by through holes which penetrate from said insulative substrate to a layer that is positioned immediately below said second electrode layer; and third scribe portions which divide said second electrode layer, said first and second electrode layers of adjacent unit cells are electrically connected to each other by existence of a portion on a lower end face of said second electrode layer, said portion extending to reach said first electrode layer along inner walls of said second scribe portions, and said third scribe portions have linear parts and curved parts, said linear parts are disposed in parallel to said first scribe portions, and said curved parts are disposed in a semicircular manner so as to circumvent said second scribe portions.

2. A chalcopyrite solar cell according to claim 1, wherein a binder layer containing a nitride is disposed between said insulative substrate and said first electrode layer.

3. A chalcopyrite solar cell according to claim 2, wherein a smoothing layer which is smoother than said insulative substrate is disposed between said insulative substrate and said binder layer.

4. A chalcopyrite solar cell according to claim 3, wherein a ceramics film is interposed between said insulative substrate and said smoothing layer.

5. A method of producing a chalcopyrite solar cell, said method comprising the steps of:

forming a first electrode layer on an insulative substrate containing mica, and forming first scribe portions which linearly divide said first electrode layer;

stacking a P-type light absorbing layer made of a chalcopyrite compound, and a buffer layer on said first electrode layer, and forming second scribe portions configured by through holes which penetrate from said insulative substrate to said buffer layer;

forming a transparent n-type second electrode layer on said buffer layer, and forming a portion on a lower end face of said second electrode layer, said portion extending to reach said first electrode layer along inner walls of said second scribe portions, whereby said first and second electrode layers of adjacent unit cells are electrically connected to each other; and forming third scribe portions which divide said second electrode layer, said third scribe portions have linear parts and curved parts, said linear parts being disposed in parallel to said first scribe portions, and said curved parts being disposed in a semicircular manner so as to circumvent said second scribe portions.

6. The method according to claim 5, further comprising disposing a binder layer containing a nitride between said insulative substrate and said first electrode layer.

7. The method according to claim 6, further comprising disposing a smoothing layer which is smoother than said insulative substrate between said insulative substrate and said binder layer.

8. The method according to claim 7, further comprising interposing a ceramics film between said insulative substrate and said smoothing layer.

* * * * *